(12) United States Patent
Vaananen et al.

(10) Patent No.: US 7,957,138 B2
(45) Date of Patent: Jun. 7, 2011

(54) SYSTEM AND METHOD FOR BLOCKING LATERAL AIRFLOW PATHS BETWEEN MODULES IN AN ELECTRONIC EQUIPMENT ENCLOSURE

(75) Inventors: Pasi Jukka Vaananen, Waltham, MA (US); Stephen A. Hauser, Carlisle, MA (US); David Paul Banasek, Mesa, AZ (US)

(73) Assignee: Emerson Network Power - Embedded Computing, Inc., Madison, WI (US)

( * ) Notice: Subject to any disclaimer, the term of this patent is extended or adjusted under 35 U.S.C. 154(b) by 0 days.

(21) Appl. No.: 12/580,449

(22) Filed: Oct. 16, 2009

(65) Prior Publication Data

US 2010/0220456 A1 Sep. 2, 2010

Related U.S. Application Data

(60) Provisional application No. 61/196,435, filed on Oct. 17, 2008.

(51) Int. Cl.
*H05K 7/20* (2006.01)
(52) U.S. Cl. ......... 361/690; 361/695; 361/721; 454/184

(58) Field of Classification Search .................. None
See application file for complete search history.

(56) References Cited

U.S. PATENT DOCUMENTS

| 6,166,919 | A | * | 12/2000 | Nicolici et al. | 361/800 |
| 7,256,992 | B1 | * | 8/2007 | Stewart et al. | 361/679.48 |
| 7,459,642 | B2 | * | 12/2008 | Culpepper et al. | 174/521 |
| 7,715,188 | B2 | * | 5/2010 | Matsushima et al. | 361/679.51 |
| 7,830,659 | B2 | * | 11/2010 | Liu et al. | 361/690 |
| 2009/0027852 | A1 | * | 1/2009 | Roesner et al. | 361/690 |

* cited by examiner

*Primary Examiner* — Boris L Chervinsky
(74) *Attorney, Agent, or Firm* — Harness, Dickey & Pierce, P.L.C.

(57) ABSTRACT

A gap filler member apparatus for blocking air flow through a gap existing between an edge of a first electronics board and a surface of a second electronics board that is disposed generally perpendicular to the first electronics board, where the first and second electronics boards are coupled by at least one pair of connectors and disposed within an electronics equipment enclosure, to block air flow through the gap. The apparatus has at least one rib extending therefrom, with the base portion being secureable to the surface of the second electronics board. A rib extends away from the base portion and has a height approximately equal to a height of the gap, and a length at least as long as a length of the gap so that the rib at least substantially blocks air flow through the gap.

20 Claims, 7 Drawing Sheets

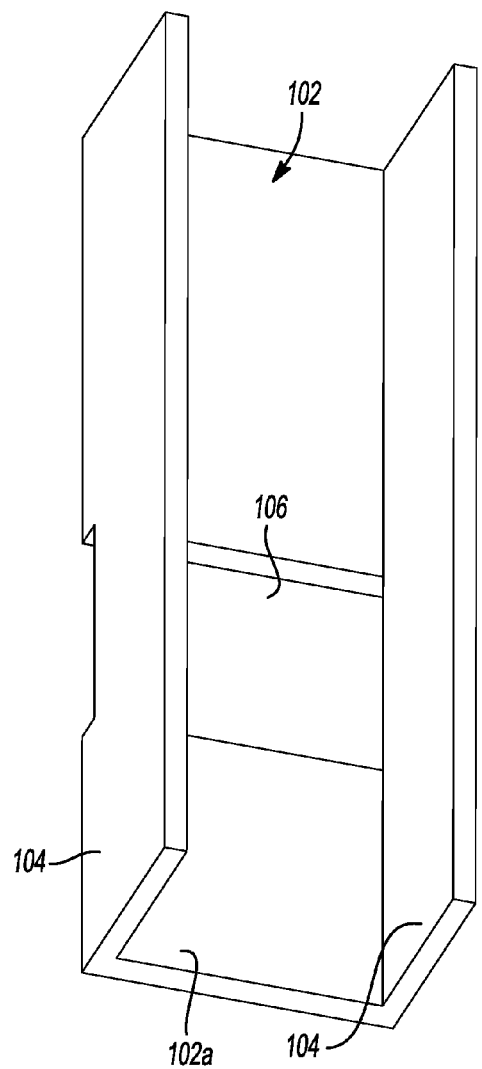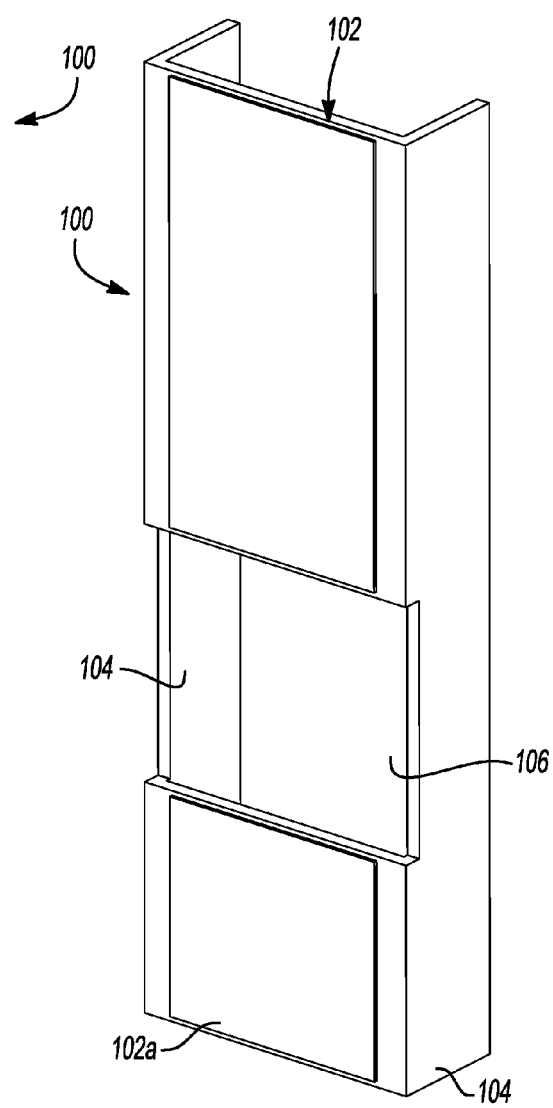
Fig-4
Fig-5

SYSTEM AND METHOD FOR BLOCKING LATERAL AIRFLOW PATHS BETWEEN MODULES IN AN ELECTRONIC EQUIPMENT ENCLOSURE

CROSS REFERENCE TO RELATED APPLICATIONS

The present application claims priority from U.S. Provisional patent application Ser. No. 61/196,435, filed Oct. 17, 2008, the entire contents of which are hereby incorporated by reference.

FIELD

The present disclosure is related to systems and methods for controlling air flow through electronic equipment cabinets, and more particularly to a system and method for blocking lateral air flow between electronic circuit board modules in an electronic equipment enclosure.

BACKGROUND

The statements in this section merely provide background information related to the present disclosure and may not constitute prior art.

Open enclosure specifications that target the communications equipment market, for example the PICMG (PCI Industrial Computer Manufacturers Group) Advanced TCA (Telecom Computing Architecture) specification, describe building practices that utilize connectors extending beyond the front board module (known as a "blade") area. The connectors provide the necessary power and signal interconnects from the blade to the system midplane.

These types of connectors typically create gaps between the system midplane and the edge of the front board that engages the connectors. The gaps create unwanted lateral air flow paths between the card slots for the front boards. This is illustrated in FIG. 1, where a rear edge 12 of a front board 10a has connectors 13 that are electrically coupled to connectors 14 extending from a midplane 16. A portion of the front board 10a may also couple to electrical connector 15. The front board 10a and midplane 16 are positioned within an enclosure 17 that typically houses a plurality of front boards in side-by-side fashion, with each front board occupying a slot within the enclosure.

In FIG. 1 the side view of front board 10a (which may be termed blade 1) can be seen to have heat sinks 18 that form a high air flow impedance along the top edge 20a of the front board 10a. Between the rear edge 12 of each front board 10a and the front surface or side 22 of the midplane board 16 (hereinafter simply "midplane 16") are formed a plurality of gaps 24. Typically several gaps 24 will exist in the plane between the rear edge 12 of the front board 10a and the connectors 14 and 15. The gaps 24 enable cooling air flows 26 being directed through each front board card slot to be diverted through the gaps 24, thus significantly reducing the intended volume of air flow over the front board 10a. FIG. 2 illustrates the air flows 26 along an adjacent front board 10b (i.e., which can be termed blade n+1) caused by heat sinks 28 at a lower edge of the front board 10b. FIG. 3 illustrates a front view looking at successively positioned front boards 10b, 10a and 10c and how the air flows 26 tend to take the paths of least impedance as the air flows come up from the below the center front board 10a and past heat sinks 28 and 29.

Addressing this undesirable lateral air flow through the gaps 24 can be challenging. The air flow path through the enclosure cardage configuration can be very complex, and typically is proportional to the impedance distributions of the available parallel paths. By the term "impedance" it is meant the resistance to air flow. Airflow follows the least restrictive path first or, put differently, the path with the least air flow impedance. A significantly higher portion of the air flow will flow through the lowest impedance path than would be suggested by simple areal proportions of the front board geometry. In essence, a large quantity of air can be diverted through the small gaps 24 if the overall impedances of the other available air flow paths are higher than the flow path impedance through the small gaps 24. If the adjacent front board card slots are not completely isolated from each other, then lateral flow paths will be formed through the gaps 24 and between the slots around the front board boundaries. These lateral paths can lead to significant air flow distribution issues, thus complicating the system integration process and requiring configuration specific thermal testing. As will be appreciated, such configuration specific thermal testing would be time consuming and expensive. Even if such testing was successfully performed, the changing out of one or more front boards at a later date could significantly alter the internal air flow distribution paths within the enclosure, thus necessitating re-testing. Still further, it may be determined that to overcome the negative consequences of the lateral air flows through the gaps 24, that an increased cooling capacity will be needed. The need for increased cooling capacity will necessitate the use of a higher capacity air mover device, or a greater number of air mover devices within the system. This will add to the overall cost of the system and increase the operational cost over time due to increased energy consumption. The use of additional air mover devices will also increase the acoustic noise emissions from the enclosure.

An additional path where the cooling air flow may escape through is at one side of the enclosure. Typically the shelf internal dimensions are not an exact multiple of the slot pitch, which leaves a small internal gap present at one side of the enclosure, as shown in FIG. 1A. For example, the slot pitch in an AdvancedTCA shelf is 30.48 mm wide. The gap in the typical shelf implementations ranges from 5 to 10 mm, representing the 16.4% to 32.8% of the total cross section area of the slot flow path. Because this area is typically almost completely empty of any solid structures, it provides a low impedance parallel air flow path for air to bypass the front board components. Since many front boards have high component density and can contain large cross-section area components, such as hard disk drives, the air flow path through the front board area often represents very high impedance. The air flow takes the lowest impedance path, which can cause substantial amounts of the cooling air flow going through the gap rather than flowing past the entire surface area of the front board. Furthermore, the volume of flow through the gap can be a significantly higher percentage of the total air flow than the relatively small cross sectional gap area would suggest. Obviously, this diverted air flow through the gap does not help in achieving the needed cooling of the components on the front board positioned adjacent to the gap.

Due to the air bypass at the side gap, the shelf air mover devices typically need to be operated at a higher speed to ensure sufficient cooling air flow through the slot cross section where the components reside (i.e., taking into account the lost air flow through the side gap). This can lead to increased acoustic noise as well as increased energy consumption.

SUMMARY

In one aspect a gap filler member apparatus is disclosed. The apparatus is adapted to block air flow through a gap existing between an edge of a first electronics board and a surface of a second electronics board that is disposed generally perpendicular to the first electronics board. The first and second electronics boards are coupled by at least one pair of connectors and disposed within an electronics equipment enclosure. The apparatus may include a base portion having at least one rib extending therefrom. The base portion may be adapted to be secured to the surface of the second electronics board. The rib extends away from the base portion and may have a height approximately equal to a height of the gap formed between the first and second electronics boards. A length of the rib may be at least as long as a length of the gap, such that the rib at least substantially blocks the gap to prevent air flow through the gap.

In another aspect the present disclosure relates to a gap filler member apparatus for blocking air flow through a gap existing between an edge of a first electronics board and a surface of a second electronics board. The boards are disposed generally perpendicular to one another and are coupled by at least one pair of connectors, and disposed within an electronics equipment enclosure. The apparatus may include a base portion having a pair of ribs extending perpendicularly therefrom. The base portion may be adapted to be secured to the surface of the second electronics board such that the ribs extend on opposite sides of the pair of connectors when the pair of connectors is coupled together. The ribs extend away from the base portion and have a height approximately equal to a height of the gap formed between the first and second electronics boards. A length of each rib may be at least as long as a length of the gap such that one of the ribs blocks the gap to prevent air flow through the gap.

In yet another aspect the present disclosure relates to a method for blocking air flow through a gap existing between an edge of a first electronics board and a surface of a second electronics board that is disposed generally perpendicular to the first electronics board. The first and second electronics boards are coupled by at least one pair of connectors and disposed within an electronics equipment enclosure. The method may include providing a base portion having at least one rib extending generally perpendicular from the base portion. The base portion may be positioned adjacent the surface of the second electronics board. The rib may be provided with a height approximately equal to a height of the gap formed between the first and second electronics boards. The rib may have a length at least as long as a length of the gap. The rib may be used to at least substantially block the gap to prevent air flow through the gap.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 4 is a perspective front view of one embodiment of a gap filler member apparatus in accordance with the present disclosure for filling the gaps between the front board and midplane in FIG. 1;

FIG. 5 is a rear perspective view of the apparatus;

DETAILED DESCRIPTION

Figure 1:
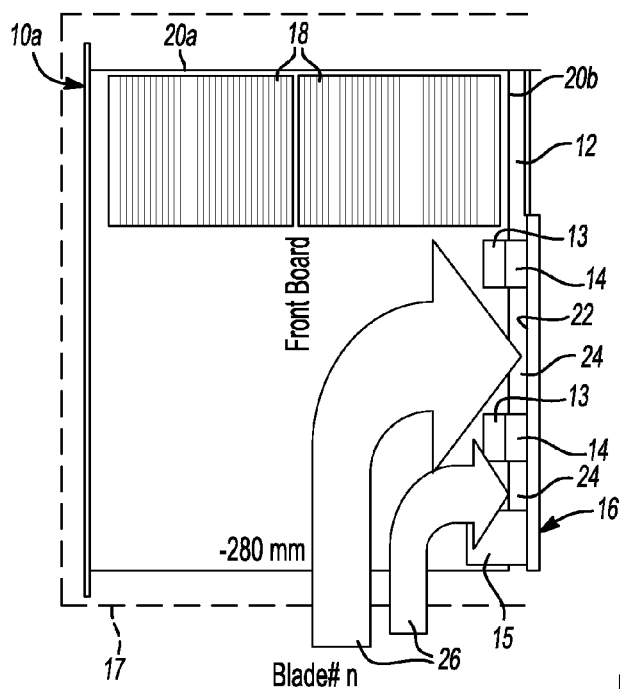
FIG. 1 is a side view of a prior art electronics equipment enclosure illustrating the gaps that are formed between an edge of a front board and a surface of a midplane that the front board is coupled to, with arrows illustrating how cooling air flows directed over the front board will take the path of lowest air flow impedance and be undesirably diverted through the gaps to avoid flowing over the heat sinks mounted at the rear edge of the front board, and thus negatively affect cooling of the front board.
Figure 2:
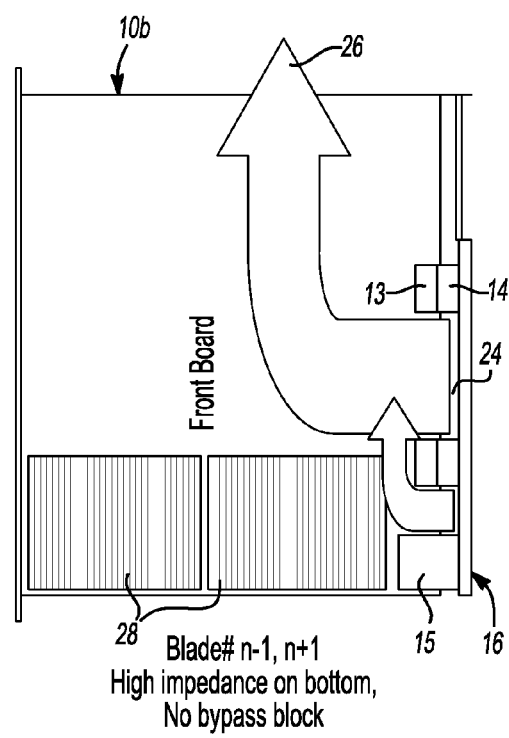
FIG. 2 is a side view of a second front board disposed adjacent to the front board of FIG. 1 illustrating how the cooling air flows may escape through the gaps and avoid cooling the heat sinks positioned at a forward edge of the second front board.
Figure 3:
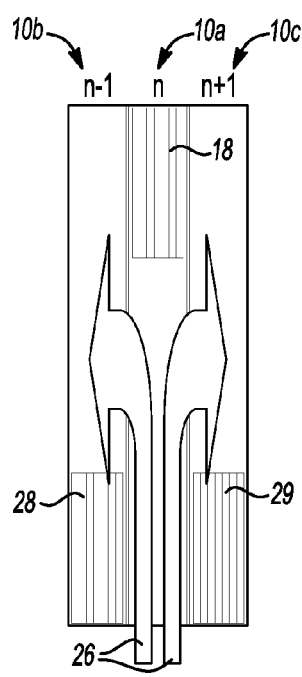
FIG. 3 is a front view of the front board of FIG. 1, the second front board of FIG. 2 and a third front board, with the boards in place in their respective card slots on the midplane, illustrating how the cooling air flows may be diverted through gaps between each of the three front boards and the midplane to avoid flowing over the high impedance heat sinks supported on each front board.

The following description is merely exemplary in nature and is not intended to limit the present disclosure, application, or uses. It should be understood that throughout the drawings, corresponding reference numerals indicate like or corresponding parts and features.

Referring to FIGS. 4-8, a gap filler member apparatus 100 is shown in accordance with one embodiment of the present disclosure. For convenience the gap filler member apparatus 100 will simply be referred to throughout the following discussion as the "apparatus 100". The apparatus 100 may include a generally planar base portion 102 having at least one rib 104 extending therefrom, and optionally a pair of ribs 104 extending generally parallel to one another and generally perpendicular from the base portion 102. For convenience, the following discussion will make reference to the apparatus 100 including a pair of the ribs 104 as shown in FIGS. 4-8, but it will be appreciated that the apparatus may be formed to include only one such rib 104. Depending upon the number of card slots incorporated into an electronics equipment enclosure, it may be necessary (or desirable) to have one embodiment of the apparatus 100 that only makes use of one rib 104.

Figure 6:
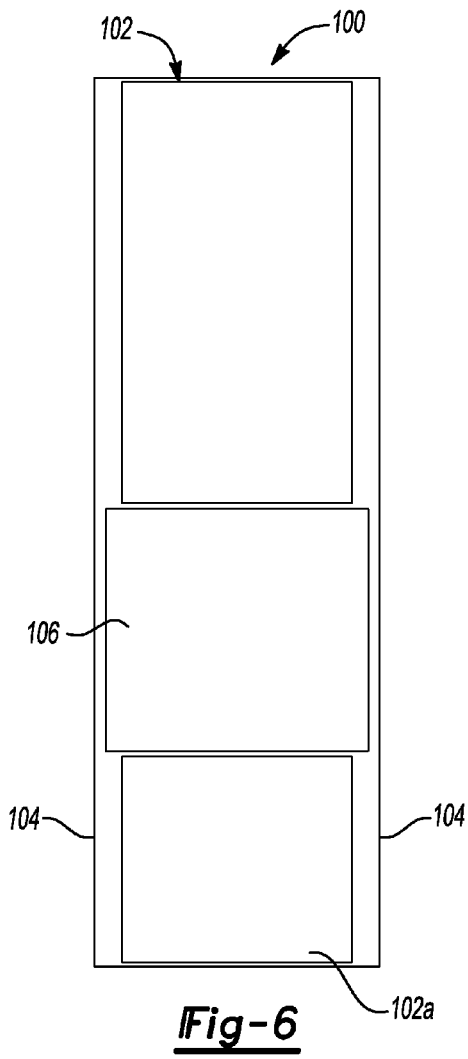
FIG. 6 is a front view of the apparatus.

Referring further to FIGS. 4-6, the base portion 102 and ribs 104 are shown as being integrally formed so that the apparatus 100 provides a single piece component. Alternatively, the base portion 102 and ribs 104 may be formed as separate component parts and fastened together with adhesives or independent fasteners. For manufacturing efficiency and cost purposes, it is expected that integrally forming the apparatus 100 from a suitable material, for example plastic, is likely to be a preferred method of manufacture.

The base portion 102 may include a cutout 106 dimensioned to receive the pair of connectors 13/14 (FIG. 1). The cutout 106 allows the apparatus 100 to be positioned over the connector pair 13/14 so that the base portion 102 may rest flush against the midplane 16. The base portion 102 may be secured to the midplane 16 with a suitable adhesive or even with external fastening elements such as threaded fasteners. It is anticipated that the easiest and quickest method for securing the apparatus 100 to the midplane 16 is likely to be the use of adhesives. In this example the cutout 106 is positioned at a point along the length of the base portion 102 so that it accepts the connector pair 13/14 and provides a lower portion 102a that at least substantially blocks, but more preferably fully blocks, the slot formed between the bottommost connector pair 13/14 in FIG. 1.

Figure 7:
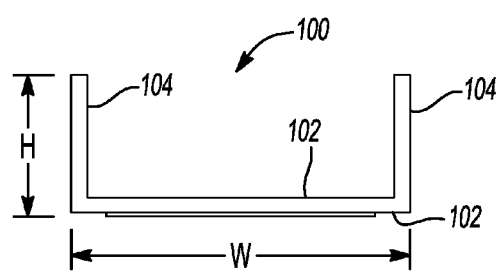
FIG. 7 is an end view of the apparatus.
Figure 9:
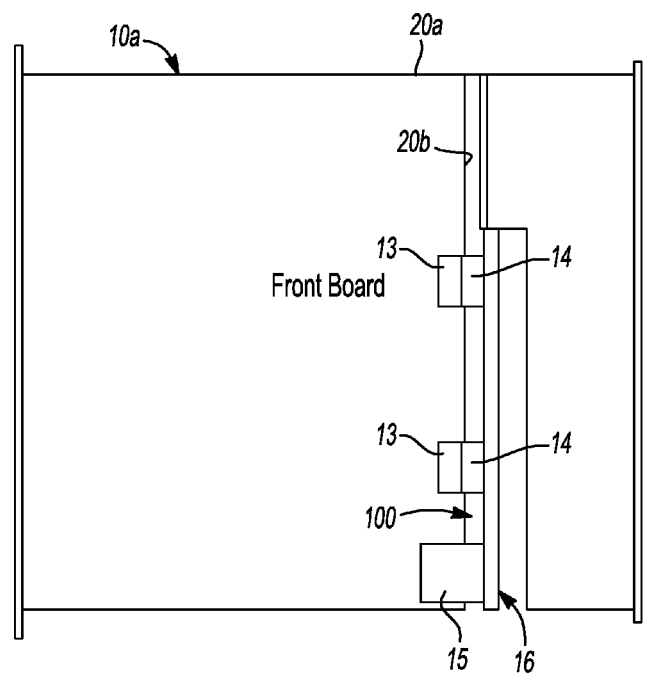
FIG. 9 is a side view of the front board and midplane of FIG. 1 with the apparatus in place to block the gaps between the rear edge of the front board and the surface of the midplane.

Referring to FIG. 7, the apparatus 100 forms a generally U-shape when viewed from an end thereof. An overall height "H" of the ribs 104 is substantially equal to the height of the gap 24 (FIG. 1), and more preferably just slightly smaller than the height of the gap so that the gap is fully or virtually fully covered by the rib 104, but so that the rib does not interfere with the connector 13 fully seating in the connector 14. The apparatus 100 is shown installed on the midplane 16 in FIG. 9. The height of the rib 104 may be selected to provide 1 mm-2 mm of clearance between the rib and the rear edge 20b of the front board 10a when the apparatus 100 is installed.

In FIG. 7 the width "W" denotes the spacing between the ribs 104. The spacing of the ribs 104 is selected in be just slightly larger than the width of the connector 14 (FIG. 1), and therefore in accordance with the spacing between adjacent front boards. Put differently, the width W is selected so that the ribs 104 of one apparatus 100 will be aligned with two adjacently located front boards installed in two adjacent card slots of the enclosure 17.

Figure 8:
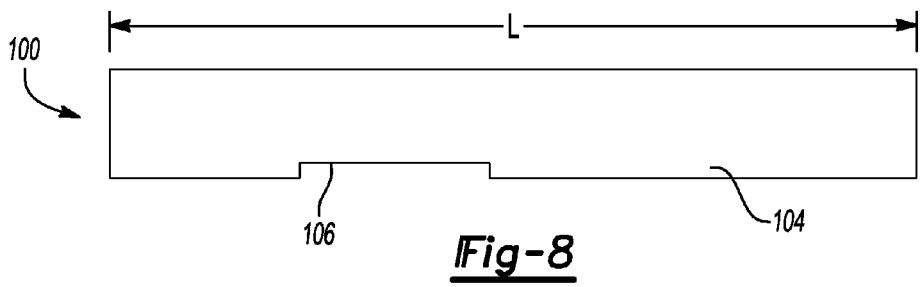
FIG. 8 is a side view of the apparatus of FIG. 6.

With reference to FIG. 8, the overall length "L" of the apparatus 100 is preferably selected so that the apparatus will be able to block all of the gaps 24 formed along the rear edge 20b of the front board 10a positioned in a single card slot of the enclosure 17. Since typically two pairs of connectors 13/14 will be used to couple the front board 10a to the midplane 16, this will require a single cutout 106 in the base portion 102. However, the apparatus 100 is not so limited and may be constructed to provide any number of cutouts along its length to accommodate more than two connector pairs.

Figure 10:
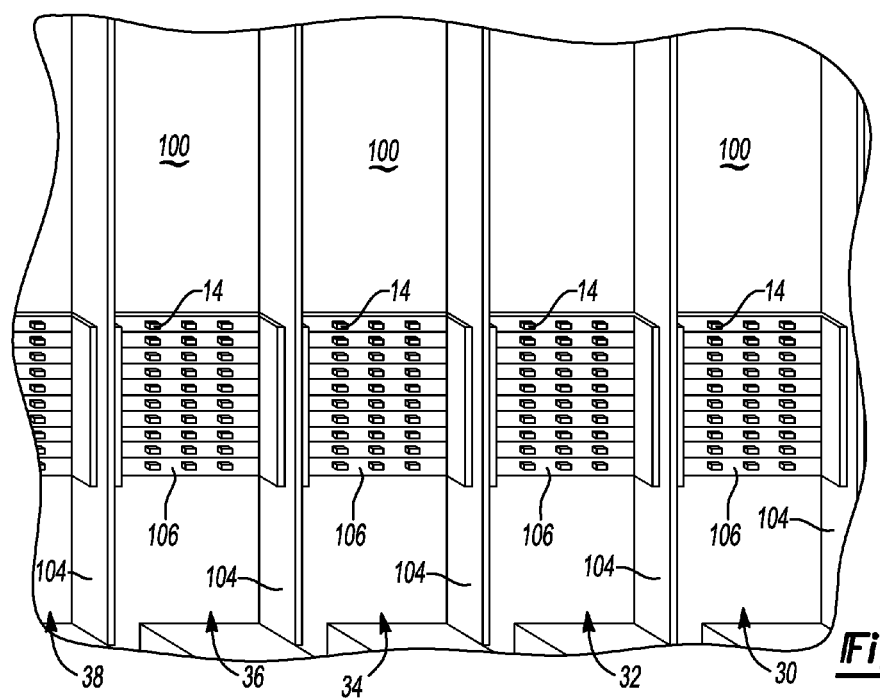
FIG. 10 is an enlarged view of a plurality of gap filler member apparatuses installed on the midplane in every other card slot of the enclosure.

With reference to FIG. 10 a plurality of the apparatuses 100 are illustrated secured to the midplane 16 surface 22. Since each apparatus 100 in this example includes a pair of ribs 104, only every other one of the card slots 30, 32, 34, 36 require the apparatus 100. Thus, card slots 30, 34 and 38 each have the apparatus 100 installed therein while slots 32 and 36 do not. This feature of the apparatus 100 enables the total number of card slots of the enclosure 17 to be blocked by a quantity of the apparatus 100 that is only half that of the number of card slots.

Figure 11:
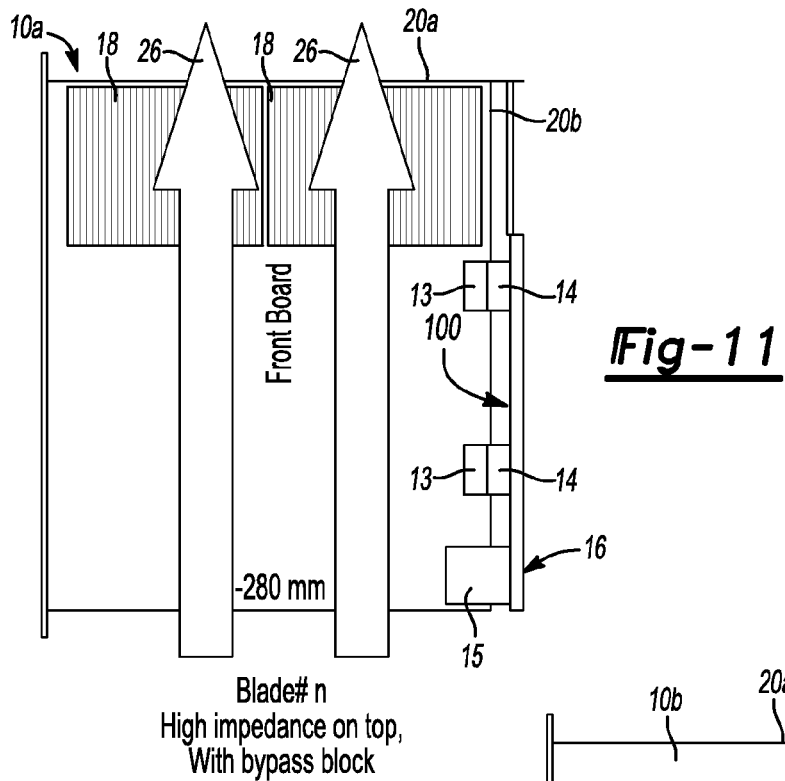
FIGS. 11-13 illustrate the air flows over the front boards of FIGS. 1-3 after the apparatus is installed to block the gaps.
Figure 12:
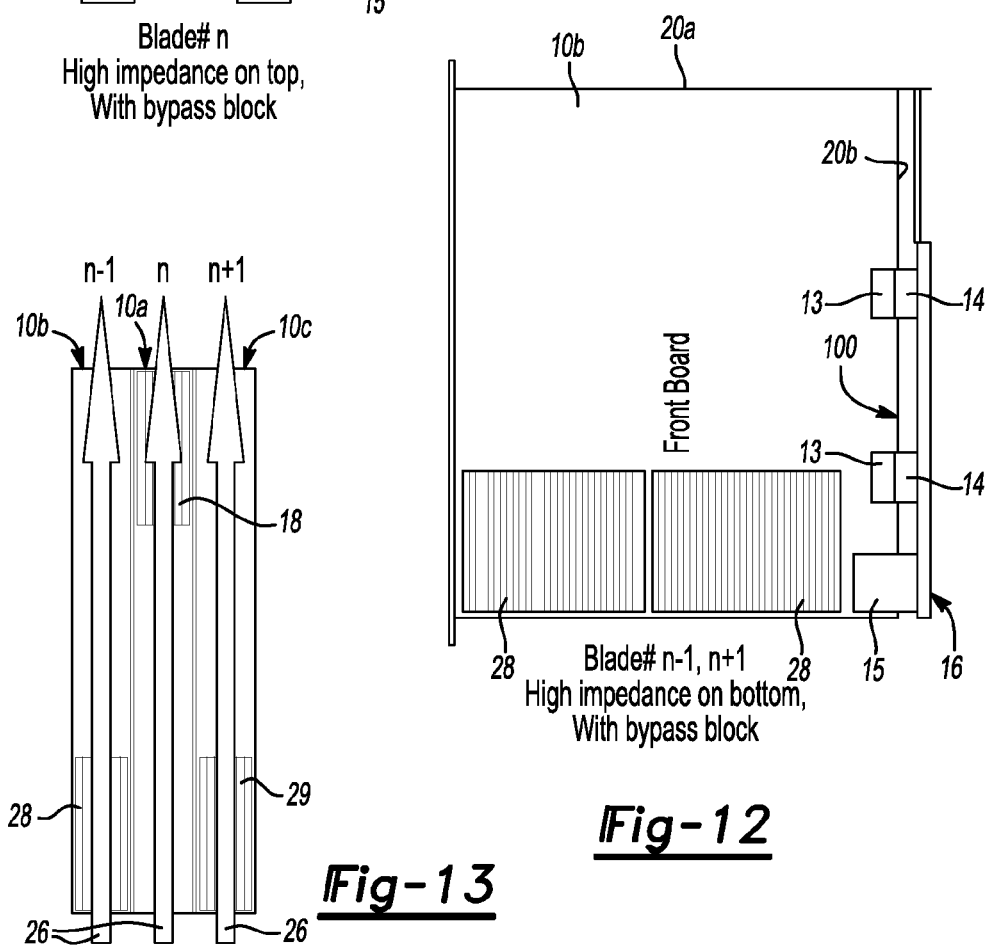
Figure 13:
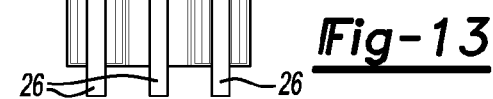

FIGS. 11-13 illustrate the air flows 26 over the front boards 10a, 10b and 10c after the apparatus 100 has been installed. The full air flow volume intended to flow through each card slot is directed over the front board located in each card slot.

When installing the apparatuses 100 on the midplane 16, fixtures may be developed to help provide accurate positioning of the apparatuses 100. Any adhesive able to provide a strong bond for securing the apparatuses 100 to the midplane 16 would be suitable for use.

The apparatus 100 enables the lateral air flow gaps 24 to be sealed without introducing mechanical interference issues with the mating of the front board 10a to the midplane 16. Another advantage is that no modifications are needed to the front boards. The apparatus 100 serves to block the air flow gaps 24, which in turn enables the full volume of air flow flowing within a given card slot to flow over the front board in that given card slot, regardless of the components mounted on the front board that may present significant air flow impedances. The use of the apparatus 100 thus significantly simplifies the air flow studies that are performed during initial evaluation of the cooling system air flows through the enclosure to ensure that all the front boards of a given cardage configuration receive a sufficient volume of cooling air flow. The apparatus 100 provides the additional advantage that should the cardage configuration be changed after the initial installation of an enclosure at a user's site, that one can be assured that differently located air flow impedances on the new front board will have no affect on the path of air flow through the card slot into which the new front board is installed. Thus, no further air flow verification tests are generally needed when the cardage configuration is changed.

The apparatus 100 provides the additional advantage that since the cooling air flows are not diverted through the gaps 24, a cost savings in operation of the cooling subsystem may be realized since the air flows through the enclosure will be providing maximum cooling to the front boards. Furthermore, a reduction in the acoustic noise emissions from the enclosure may be realized by blocking the gaps.

Figure 14:
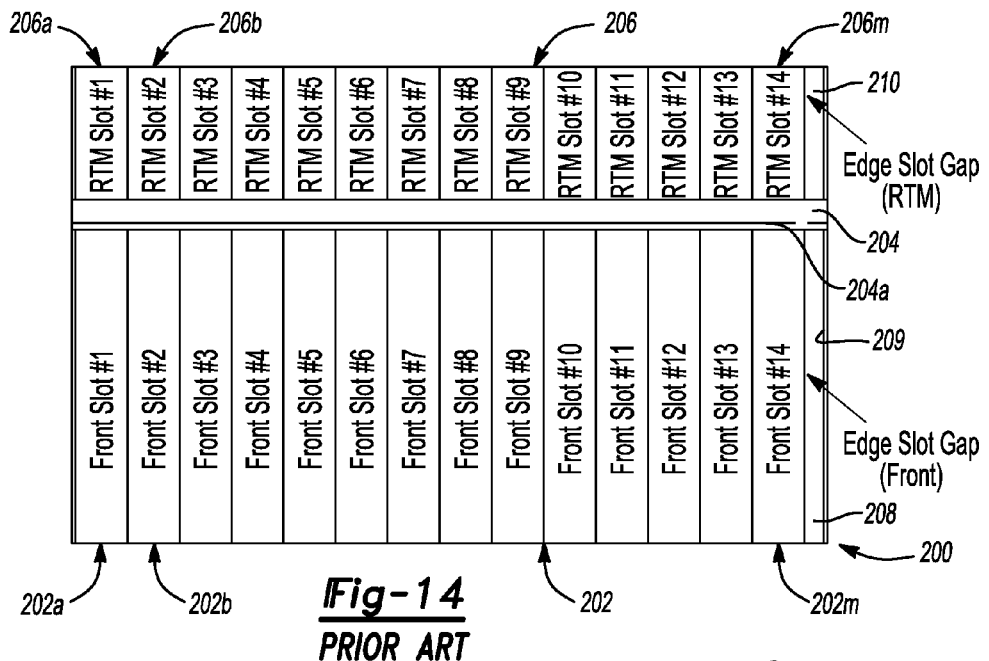
FIG. 14 is a top view looking down on an equipment enclosure to illustrate the internal gaps that exist at one side of the enclosure on both sides of a backplane of the enclosure.

Referring to FIG. 14, an enclosure 200 is shown, which for example may be an AdvancedTCA enclosure. The enclosure 200 includes a front board card cage area 202 that has a plurality of card slots 202a-202m for receiving front boards (not shown) that mate to a backplane 204. The enclosure 200 also includes an RTM (rear transition module) card cage 206 having a plurality of RTM card slots 206a-206m. At one side of the enclosure 200 a gap 208 is formed between card slot 202m and an interior wall surface 209 of the enclosure 200. Similarly, a gap 210 is formed between RTM card slot 206m and the interior wall surface 209 of the enclosure 200 but on the opposite side of the backplane 204. A cross member 204a may extend widthwise within the interior area of the enclosure 200 and may be positioned adjacent to, or against, the backplane 204.

Figure 15:
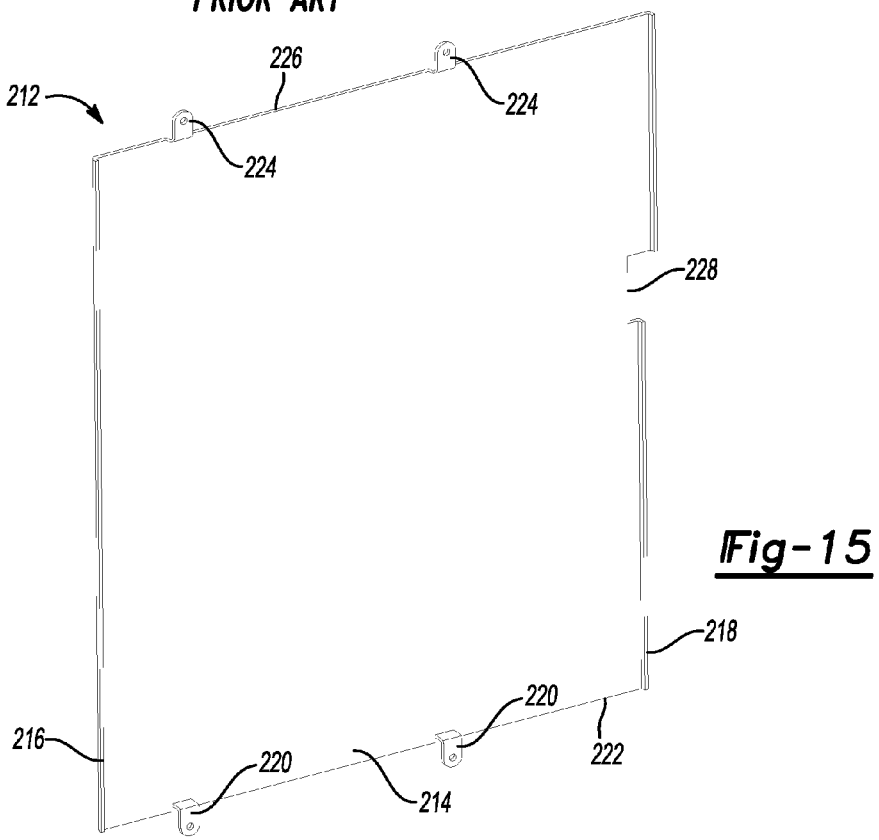
FIG. 15 is a perspective view of the filler plate shown in FIG. 15 that is used to fill in the gap in the front board card cage area of the enclosure.
Figure 16:
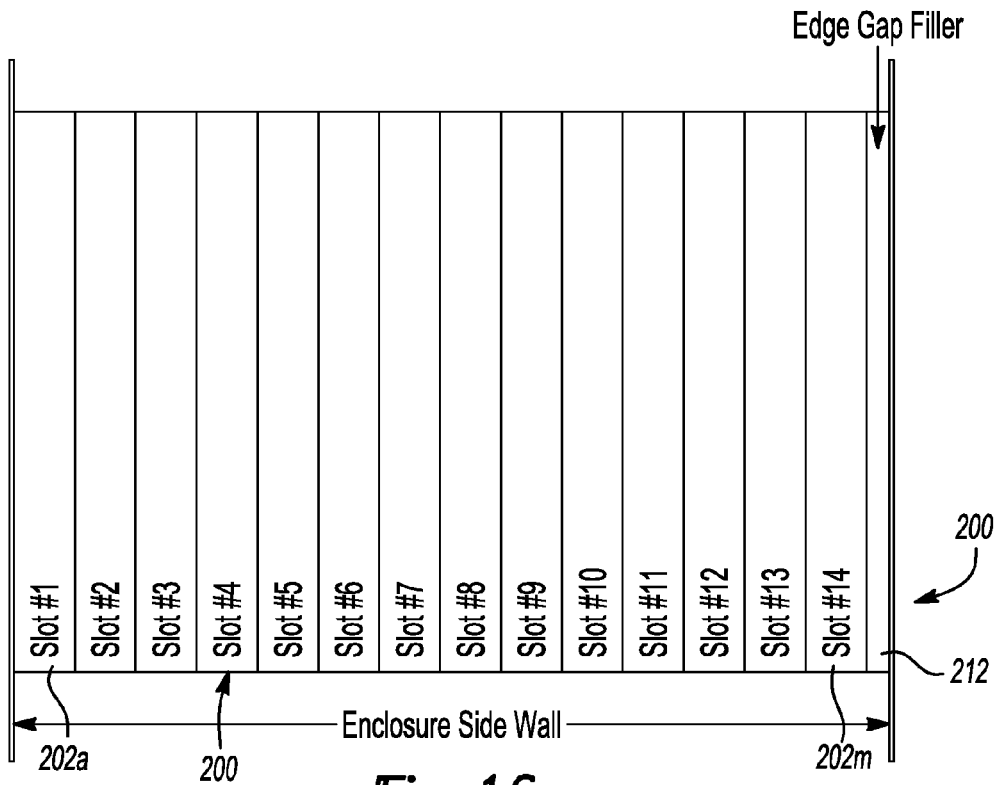
FIG. 16 shows the gap filler plate of FIG. 15 installed in an enclosure.

Referring now to FIG. 15, a gap filler panel 212 is illustrated. The gap filler panel 212 includes a main panel area 214 having a folded front corner 216 and a folded rear corner 218. Tabs 220 extend from a lower edge 222 while tabs 224 extend from an upper edge 226. The main panel area 214 also includes a notch 228 positioned to receive the cross member 204a that extends laterally within the enclosure 200. The notch 228 enables folded rear corner 218 to be positioned closely adjacent or against the backplane 204 without interference from the cross member 204a. The tabs 220 and 224 enable the gap filler panel 212 to be secured with rivets or threaded fasteners to the interior wall surface 209 of the enclosure 200. The gap filler panel 212 is shown secured in place in the enclosure 200 in FIG. 16.

It will be appreciated that the folded corner edges 216 and 218 preferably each have a distance which enables the edges 216 and 218 to substantially extend the width of the gap 208, and thus to at least substantially, or virtually completely, block the gap. The gap filler panel 212 may be formed from steel, plastic or any other suitably rigid material. Air-tight closed-cell foam or rubber could possibly also be used to form the gap filler panel 212.

While not shown explicitly, it will be appreciated that the gap 210 in the RTM card cage 206 could also be filled with a panel such as gap filler panel 212. The dimensions of the gap filler panel for use in the RTM card cage 206 would need to be selected such that the panel, when installed, substantially fills the gap 210.

It will also be appreciated that the gap 208 could be positioned to the leftmost side, rightmost side, or divided in some proportion between these locations at opposite sides of the enclosure 200. Regardless of the gap position, the gap filler panel 212 could easily be implemented with only minor modifications to seal the gap.

The gap filler panel 212 could also be applied to enclosures where the card cage and slots are oriented horizontally. Such implementations are typically required to be external integer multiples of "Rack Units" (i.e. 1.75 Inches or 44.45 mm) to avoid air flow bypass between shelves mounted in the rack, which often may not be integer multiples of the slot pitch. Such implementations produce similar issues as shelves with vertically oriented card cages like that shown with enclosure 200.

If the available space envelope of the enclosure 200 allows, and there is a need for some shelf-specific modules (such as management modules, power entry modules/power supplies, etc.), then the card slots 202 can be made to be of integer multiple of the module pitch, and available space can be utilized for such modules. This has been previously implemented in some shelves, particularly in CompactPCI and VME shelves, often requiring power modules somewhere. One manner for addressing this issue in such situations is to have a wall separating the air flow path between the first and/or last standard slot and the non-standard slot. This wall can be an integral part of the enclosure 200, or part of the module, as long as the adjacent standard slot dimensions remain as desired. This allows the control of the air flow through the non-standard modules with respect to the adjacent standard modules by controlling the slot air flow impedances, eliminating the wasted air flow problem. Obviously, this solution cannot be used if there is no extra space, which is typical in ATCA shelf implementations, particularly in the case of a 16-slot shelf in a 500 mm mounting aperture.

Figure 17:
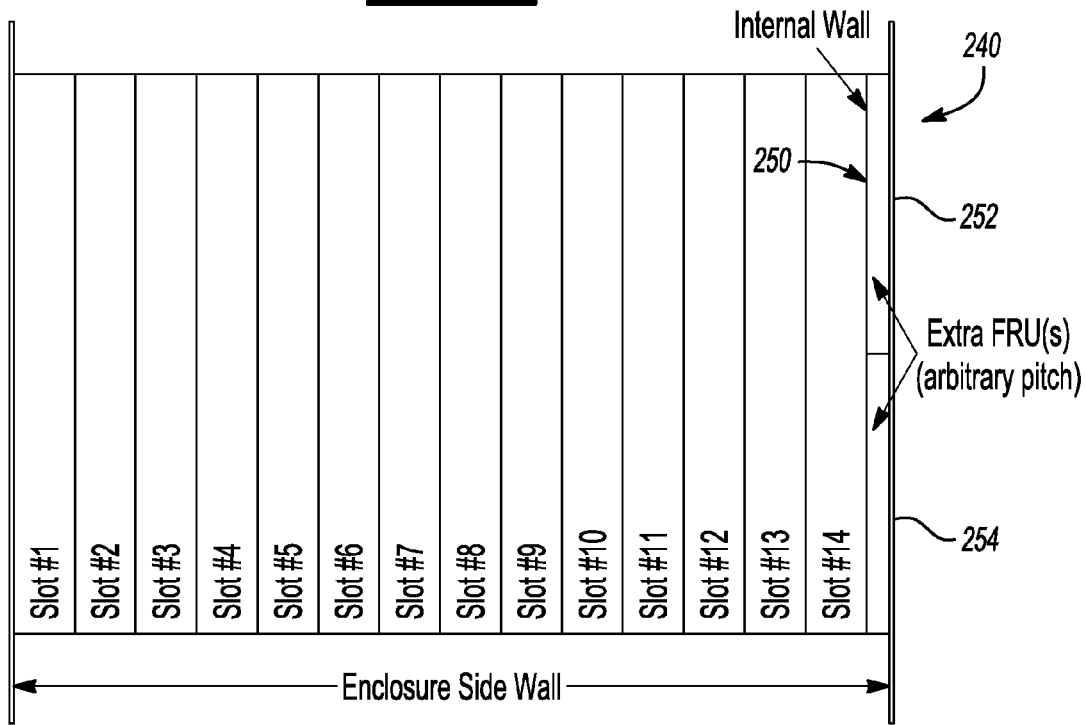
FIG. 17 shows an alternative implementation where an internal wall is positioned to form a slot having a desired width, where a pair of field replacement units (FRUs) may be located in the slot.

In a 14 card slot ATCA shelf with a 450 mm mounting aperture there is some free space, which can be sufficient to host PCB assemblies, such as shelf management modules. FIG. 17 illustrates an example of one preferred way to utilize this space, utilizing an internal wall 250 within an enclosure 240 to separate the modules 252 and 254 to their own compartments, where air flow can be adequately managed.

The gap filler panel 212 thus helps to guarantee predictable air flow through all of the card slots 202a-202m, and particularly the card slot 202m located immediately adjacent to the gap 208. The use of the gap filler panel 212 may also lead to reductions in both cooling subsystem energy consumption and system acoustic noise emissions.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A gap filler member apparatus for blocking air flow through a gap existing between an edge of a first electronics board and a surface of a second electronics board that is disposed generally perpendicular to said first electronics board, where the first and second electronics boards are coupled by at least one pair of connectors and disposed within an electronics equipment enclosure, to block air flow through the gap, the apparatus comprising:
   a base portion having at least one rib extending therefrom, said base portion adapted to be secured to said surface of said second electronics board; and
   said rib extending away from said base portion and having a height approximately equal to a height of said gap formed between said first and second electronics boards, and a length of the rib being at least as long as a length of the gap, such that said rib at least substantially blocks the gap to prevent air flow through the gap.

2. The apparatus of claim 1, wherein said surface of said base portion is adapted to be adhered to said second electronics board via an adhesive.

3. The apparatus of claim 1, wherein said base portion includes an additional rib spaced apart from said rib and extending generally parallel to said rib, and having dimensions at least substantially equal to said rib, to block an additional gap existing between an additional electronics board coupled to said second electronics board adjacent to said first electronics board.

4. The apparatus of claim 3, wherein said base portion, said rib and said additional rib form a U-shape when viewed from an end of said apparatus.

5. The apparatus of claim 1, wherein said base portion includes:
   a cutout to enable a portion of said pair of connectors to project therethrough when said connectors are engaged with one another; and
   wherein portions of said base portion extend from opposite sides of said cutout so that said apparatus may be placed flush against said second electronics board and over said engaged connectors.

6. The apparatus of claim 5, wherein the base portion is secured to the second electronics board.

7. The apparatus of claim 1, wherein said base portion includes:
   a cutout having dimensions sufficient to enable a portion of said pair of connectors to project therethrough when said connectors are engaged with one another; and
   an additional rib spaced apart from said rib such that said base portion, said rib and said additional rib form a U-shape when viewed from one end of the apparatus; and
   wherein the rib and additional rib extend perpendicularly from said base portion along a full length of said base portion so that said cutout is positioned at an intermediate point along a length of said base portion.

8. The apparatus of claim 1, wherein the apparatus comprises an integrally formed component formed from plastic.

9. The apparatus of claim 1, wherein the apparatus simultaneously blocks said gap and an additional gap, wherein said gap and said additional gap are present on opposite sides of said pair of connectors when said pair of connectors are coupled together.

10. A gap filler member apparatus for blocking air flow through a gap existing between an edge of a first electronics board and a surface of a second electronics board that is disposed generally perpendicular to said first electronics board, where the first and second electronics boards are coupled by a pair of connectors and disposed within an electronics equipment enclosure, to block air flow through the gap, the apparatus comprising:

a base portion having a pair of ribs extending perpendicularly therefrom, said base portion adapted to be secured to said surface of said second electronics board such that said ribs extend on opposite sides of said pair of connectors when said pair of connectors is coupled together; and said ribs extending away from said base portion and having a height approximately equal to a height of said gap formed between said first and second electronics boards, and a length of each said rib being at least as long as a length of the gap, such that one of the ribs blocks the gap to prevent air flow through the gap.

11. The apparatus of claim 10, wherein the apparatus has a U-shape when viewed from one end thereof.

12. The apparatus of claim 11, wherein the apparatus includes a cutout formed in said base portion between said pair of ribs.

13. The apparatus of claim 12, wherein the cutout has dimensions enabling said pair of connectors to project therethrough when said apparatus is positioned adjacent said second electronics board.

14. The apparatus of claim 10, wherein the apparatus comprises an integrally formed component.

15. The apparatus of claim 10, wherein a first one of the pair of ribs blocks the gap, and wherein a second one of the pair of ribs blocks an additional gap formed by an additional first electronics board mounted on said second electronics board.

16. A method for blocking air flow through a gap existing between an edge of a first electronics board and a surface of a second electronics board that is disposed generally perpendicular to said first electronics board, where the first and second electronics boards are coupled by at least one pair of connectors and disposed within an electronics equipment enclosure, the method comprising:

providing a base portion having at least one rib extending generally perpendicular from the base portion;

positioning said base portion adjacent said surface of said second electronics board; and providing said rib with a height approximately equal to a height of said gap formed between said first and second electronics boards, and a length at least as long as a length of the gap; and using said rib to at least substantially block the gap to prevent air flow through the gap.

17. The method of claim 16, wherein said providing a base portion having at least one rib further comprises providing a base portion having a pair of parallel ribs extending generally parallel to one another.

18. The method of claim 17, further comprising securing said base portion to said second electronics board.

19. The method of claim 16, wherein said providing a base portion having at least one rib comprises providing an integrally formed component having said rib and an additional rib extending perpendicularly from said base portion.

20. The method of claim 19, further comprising forming said base portion with a cutout having dimensions enabling said connectors to project through the cutout.

* * * * *